US009997541B2

(12) United States Patent
Jeong et al.

(10) Patent No.: US 9,997,541 B2
(45) Date of Patent: Jun. 12, 2018

(54) LIQUID CRYSTAL DISPLAY DEVICE

(71) Applicant: SAMSUNG DISPLAY CO., LTD., Yongin-si, Gyeonggi-do (KR)

(72) Inventors: Youn Hak Jeong, Cheonan-si (KR); Bo Yeong Kim, Asan-si (KR); Jang Soo Kim, Asan-si (KR); Hong Min Yoon, Seoul (KR); Seong Young Lee, Hwaseong-si (KR); Ho Jun Lee, Asan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days. days.

(21) Appl. No.: 14/989,477

(22) Filed: Jan. 6, 2016

(65) Prior Publication Data
US 2016/0246089 A1 Aug. 25, 2016

(30) Foreign Application Priority Data

Feb. 23, 2015 (KR) ........................ 10-2015-0025397

(51) Int. Cl.
G02F 1/1362 (2006.01)
H01L 27/12 (2006.01)
G02F 1/1343 (2006.01)
H01L 29/423 (2006.01)

(52) U.S. Cl.
CPC ...... H01L 27/1222 (2013.01); G02F 1/13624 (2013.01); G02F 1/134309 (2013.01); H01L 27/124 (2013.01); H01L 29/42384 (2013.01); G02F 1/136286 (2013.01); G02F 2001/134318 (2013.01); G02F 2001/134345 (2013.01)

(58) Field of Classification Search
CPC .................................................. G02F 1/13624
See application file for complete search history.

(56) References Cited

U.S. PATENT DOCUMENTS

2012/0062537 A1* 3/2012 Jeong .................. G09G 3/3659
345/211
2013/0135572 A1* 5/2013 Park .................. G02F 1/134336
349/143

FOREIGN PATENT DOCUMENTS

| KR | 1020080097793 | 11/2008 |
| KR | 1020090049174 | 5/2009 |
| KR | 1020100024140 | 3/2010 |

(Continued)

Primary Examiner — Edmond Lau
(74) Attorney, Agent, or Firm — F. Chau & Associates, LLC

(57) ABSTRACT

A liquid crystal display includes: first and second thin film transistors and a compensation transistor formed on a first insulation substrate; a first gray subpixel electrode connected to a drain electrode of the first thin film transistor; a second gray subpixel electrode connected to a drain electrode of the compensation transistor and a drain electrode of the second thin film transistor; and first and second reference voltage lines overlapping at least one of the second gray subpixel electrode and the first gray subpixel electrode, wherein a pixel area occupied by the first gray subpixel electrode and the second gray subpixel electrode is extended in a first direction, the first and second reference voltage lines are extended in a second direction, which is substantially perpendicular to the first direction, to overlap the pixel area, and one of the first and second reference voltage lines is connected to a source electrode of the compensation transistor.

12 Claims, 11 Drawing Sheets

(56) References Cited

FOREIGN PATENT DOCUMENTS

KR         100997974     11/2010
KR    1020140100126     8/2014

* cited by examiner

LIQUID CRYSTAL DISPLAY DEVICE

CROSS-REFERENCE TO RELATED APPLICATION

This application claims priority under 35 U.S.C. § 119 to Korean Patent Application No. 10-2015-0025397 filed in the Korean Intellectual Property Office on Feb. 23, 2015, the disclosure of which is incorporated by reference herein in its entirety.

TECHNICAL FIELD

Exemplary embodiments of the present invention relate to a liquid crystal display.

DESCRIPTION OF THE RELATED ART

A liquid crystal display (LCD) is one of the most common types of flat panel displays. The LCD includes a display panel on which a field generating electrode, such as a pixel electrode, is formed, another display panel on which another field generating electrode, such as a common electrode, is formed, and a liquid crystal layer interposed between the two display panels.

In the LCD, voltages are applied to the field generating electrodes to generate an electric field in the liquid crystal layer. The electric field determines the alignment of liquid crystal molecules in the liquid crystal layer to control the polarization of incident light, thereby enabling images to be displayed.

There are a variety of LCDs, such as a twisted nematic (TN) LCD and a vertically aligned (VA) LCD. In the VA LCD, liquid crystal molecules are aligned such that long axes of the liquid crystal molecules are perpendicular to a display panel in a state in which no electrical field is applied.

In the VA LCD, side visibility can be realized by, e.g., forming cutouts such as minute slits in the field generating electrodes.

Since the cutouts and protrusions can determine tilt directions of the liquid crystal molecules, the tilt directions can be distributed in various directions by using the cutouts and protrusions, thereby widening the VA LCD's reference viewing angle.

SUMMARY

An exemplary embodiment of the present invention provides a liquid crystal display including: first and second thin film transistors and a compensation transistor formed on a first insulation substrate; a first gray subpixel electrode connected to a drain electrode of the first thin film transistor; a second gray subpixel electrode connected to a drain electrode of the compensation transistor and a drain electrode of the second thin film transistor; and first and second reference voltage lines overlapping at least one of the second gray subpixel electrode and the first gray subpixel electrode, wherein a pixel area occupied by the first gray subpixel electrode and the second gray subpixel electrode is extended in a first direction, the first and second reference voltages lines are extended in a second direction, which is substantially perpendicular to the first direction, to overlap the pixel area, and one of the first and second reference voltage lines is connected to a source electrode of the compensation transistor.

Each of the second gray subpixel electrode and the first gray subpixel electrode may include at least one pixel central part and a plurality of branches which extend from the pixel central part.

The liquid crystal display may further include a second insulation substrate disposed opposite to the first insulation substrate; and a common electrode disposed on the second insulation substrate, and the common electrode may include a cross-shaped opening corresponding to the pixel central part.

The common electrode may further include a central opening.

The pixel central electrode and the branches may constitute one unit pixel electrode, and a plurality of unit pixel electrodes arranged in two rows may be disposed in the pixel area.

The second gray subpixel electrode may be disposed in the unit pixel electrode disposed at a center of a first row of the two rows.

The first gray subpixel electrode may be disposed in the remaining unit pixel electrodes of the first row and in the unit pixel electrodes of a second row of the two rows.

The first and second reference voltage lines may be extended in the second direction along the pixel central part of the first gray subpixel electrode.

The first gray subpixel electrode may include two first gray subpixel electrodes, the second gray subpixel electrode may include one second gray subpixel electrode, and the one second gray subpixel electrode may be disposed between the two first gray subpixel electrodes.

The first and second reference voltage lines may be respectively disposed in the second direction along pixel central parts of the two first gray subpixel electrodes.

The second gray subpixel electrode may include two second gray subpixel electrodes, the first gray subpixel electrode may include one first gray subpixel electrode, and the one first gray subpixel electrode may be disposed between the two second gray subpixel electrodes.

The first and second reference voltage lines may be respectively disposed in the second direction along pixel central parts of the two second gray subpixel electrodes.

The second gray subpixel electrode may be arranged in a first row, and the first gray subpixel electrode may be arranged at a side of the second gray subpixel electrode in the first row, or may be arranged in a second row.

The first and second reference voltage lines may be extended in the second direction to overlap the second gray subpixel electrode and the first gray subpixel electrode.

The liquid crystal display may further include gate lines extended in the first direction; and data lines extended in the second direction, and all gate electrodes of the first and second thin film transistors and the compensation transistor are connected to a first gate line.

All source electrodes of the first and second thin film transistors may be connected to a first data line.

The first and second thin film transistors, the compensation transistor, the first gray subpixel electrode, and the second gray subpixel electrode may be included in a first pixel, a second pixel is disposed adjacent to the first pixel along an extending direction of the first data line and may be connected to a second gate line and a second data line, and the first pixel and the second pixel may be connected to different ones of the first and second reference voltage lines.

Voltages of high and low levels that are swung at a predetermined cycle may be applied to the first and second reference voltage lines, and the voltages applied to the first and second reference voltage lines have inverted levels.

The first and second thin film transistors, the compensation transistor, the first gray subpixel electrode, and the second gray subpixel electrode may be included in a first pixel, a third pixel is disposed adjacent to the first pixel along an extending direction of the first data line and may be connected to a third gate line and a third data line, and a same voltage may be applied to the first and second reference voltage lines which are respectively connected to the first pixel and the third pixel.

Voltages of high and low levels that are swung at a predetermined cycle may be applied to the first and second reference voltage lines, and the voltages applied to the first and second reference voltage lines have inverted levels.

An exemplary embodiment of the present invention provides a liquid crystal display including: a plurality of pixels arranged in rows and columns; a plurality of gate lines arranged in an extending direction of the rows; a plurality of data lines arranged in an extending direction of the columns; first and second reference voltage lines arranged in the extending direction of the columns; wherein the first and second reference voltage lines are adjacent to each other, the first reference voltage line is connected to a first pixel in a first row and a first column, and the second reference voltage line is connected to a second pixel in a second row and the first column.

The first pixel may include a compensation transistor.

The first reference voltage line may be connected to an electrode of the compensation transistor.

A first gate line may be connected to a control terminal of the compensation transistor.

An exemplary embodiment of the present invention provides a liquid crystal display including: a plurality of pixels arranged in pixel rows and pixel columns; a plurality of gate lines arranged in an extending direction of the pixel rows; a plurality of data lines arranged in an extending direction of the pixel columns; first and second reference voltage lines arranged in the extending direction of the pixel columns; wherein the first reference voltage line is connected to a first pixel in a first pixel row and a first pixel column, the second reference voltage line is connected to a second pixel in a second pixel row and the first pixel column, the first and second pixels are adjacent to each other and a voltage applied to the first pixel through the first reference voltage line is different from a voltage applied to the second pixel through the second reference voltage line.

DETAILED DESCRIPTION OF THE EMBODIMENTS

Figure 1:
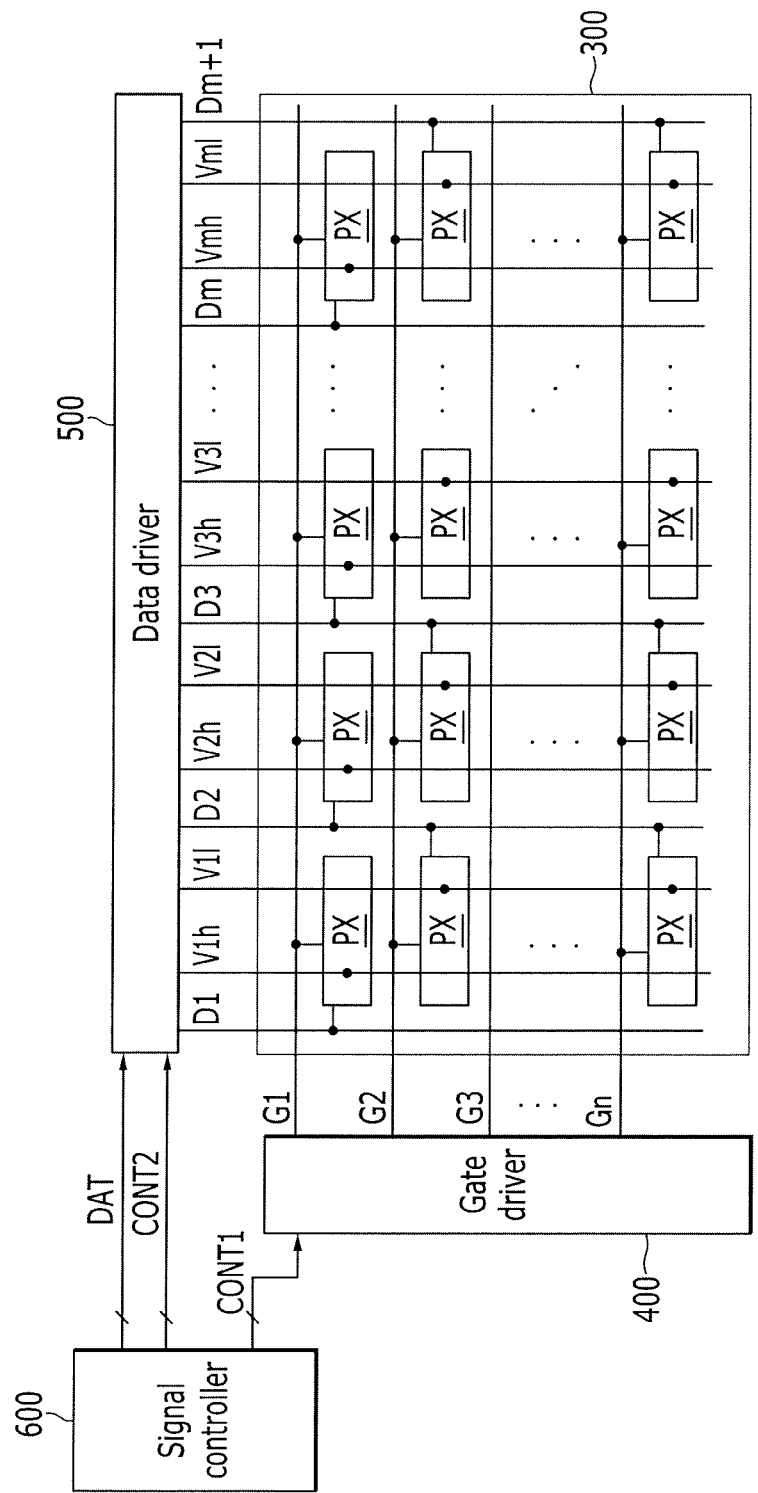
FIG. 1 is a block diagram of a display device according to an exemplary embodiment of the present invention.

Hereinafter, exemplary embodiments of the present invention will be described more fully with reference to the accompanying drawings. However, the described embodiments may be modified in various different ways, and should not be construed as limited to the embodiments disclosed herein.

In the drawings, the thickness of layers, films, panels, regions, etc., may be exaggerated for clarity. Like reference numerals may designate like elements throughout the specification. It will be understood that when an element, such as a layer, film, region, or substrate, is referred to as being "on" another element, it can be directly on the other element or intervening elements may also be present.

A display device according to an exemplary embodiment of the present invention will be described in detail with reference to FIG. 1.

FIG. 1 is a block diagram of a display device according to an exemplary embodiment of the present invention.

The display device according to the exemplary embodiment of the present invention, as shown in FIG. 1, includes a display panel 300 for displaying an image, a data driver 500 and a gate driver 400 for driving the display panel 300, and a signal controller 600 for controlling the data driver 500 and the gate driver 400.

The display panel 300 includes a plurality of gate lines G1-Gn, a plurality of data lines D1-D(m+1), and a plurality of reference voltage lines V1h-Vmh and V1l-Vml.

The gate lines G1-Gn are disposed to extend in a horizontal direction, and the data lines D1-D(m+1) are disposed to cross the gate lines G1-Gn while being insulated therefrom and to extend in a vertical direction. Further, the reference voltage lines V1h-Vmh and V1l-Vml are disposed to extend in the vertical direction between the data lines D1-D(m+1). The reference voltage lines V1h-Vmh and V1l-Vml also cross the gate lines G1-Gn while being insulated therefrom.

The reference voltage lines V1h-Vmh and V1l-Vml are divided into first reference voltage lines V1h-Vmh and second reference voltage lines V1l-Vml. Two voltages of high and low levels that are swung at a predetermined cycle are applied to the first reference voltage lines V1h-Vmh and the second reference voltage lines V1l-Vml. In this case, when a high level voltage is applied to the first reference voltage lines V1h-Vmh, a low level voltage is applied to the second reference voltage lines V1l-Vml. As a result, voltages having inverted levels are applied thereto. A first same voltage is applied to the first reference voltage lines V1h-Vmh, and a second same voltage is applied to the second reference voltage lines V1l-Vml.

One pixel is connected to one of the gates lines G1-Gn, one of the data lines D1-D(m+1), and one of the reference voltage lines V1h-Vmh and V1l-Vml. The pixels PX are arranged in a matrix shape, each pixel PX is formed to extend in the horizontal direction, which is a direction extending from the gate lines G1-Gn. However, each pixel PX may be extended in the vertical direction. Each pixel PX includes two subpixels (e.g., a high gray subpixel and a low gray subpixel), and each of the subpixels may include a thin film transistor, a liquid crystal capacitor, and a storage capacitor. The high gray subpixel of the two subpixels may further include a compensation transistor.

Each control terminal of thin film transistors included in the two subpixels may be connected to one gate line G1-Gn, each input terminal of the thin film transistors may be connected to one data line D1-D(m+1), and each output terminal of the thin film transistors may be connected to a first terminal (e.g., a pixel electrode) of the liquid crystal capacitor and a first terminal of a storage capacitor. A second terminal of the liquid crystal capacitor may be connected to a common electrode, and a second terminal of the storage capacitor may receive a storage voltage Vcst.

Further, a control terminal of a compensation translator is connected to one gate line G1-Gn, for example, a gate line that is the same as the gate line connected to a corresponding thin film transistor, an output terminal of the compensation transistor is connected to one of the reference voltage lines V1$h$-Vmh and V1$l$-Vml, and an input terminal of the compensation transistor is connected to the liquid crystal capacitor and the storage capacitor.

According to an exemplary embodiment of the present invention, a channel layer of the thin film transistor may be formed of an amorphous silicon, polysilicon or oxide semiconductor.

In the liquid crystal display according to the exemplary embodiment of the present invention, as shown in FIG. 1, one of the data lines D1-D(m+1) is alternately connected to pixels PX disposed at a left side and a right side of the data line. In other words, when one data line (e.g., D2) is connected to a pixel disposed at the right side thereof in a first row (e.g., pixel PX connected to V2$h$), the data line is connected to a pixel disposed at the left side thereof in a second row (e.g., pixel PX connected to V1$l$) and is connected to a pixel disposed at the right side thereof in a third row. One of the gate lines G1-Gn is connected to all the pixels PX disposed in one row.

According to this structure, odd-numbered pixels PX and even-numbered pixels PX pertaining to one pixel column are connected to different data lines D1-D(m+1), and although the data lines D1-D(m+1) are applied with a data voltage of the same polarity during one frame, a polarity inversion displayed at the pixels PX appears as a dot inversion.

A number of the data lines D1-D(m+1) may be larger than a number m of the pixel columns by one. In the exemplary embodiment of the present invention as shown in FIG. 1, the first data line D1 may be alternately connected to pixels PX of the pixel column disposed at the right side of the first data line D1 since no pixel column is disposed at the left side of the first data line D1, and the $(m+1)^{th}$ data line Dm+1 may be alternately connected to pixels PX of the pixel column disposed at the left side of the $(m+1)_{th}$ data line Dm+1 since no pixel column is disposed at the right side of the $(m+1)^{th}$ data line Dm+1.

Further, in the liquid crystal display according to the exemplary embodiment of the present invention as shown in FIG. 1, the reference voltage lines V1$h$-Vmh and V1$l$-Vml are arranged in a direction that is parallel with the data lines D1-D(m+1), and one of the first reference voltage lines V1$h$-Vmh and one of the second reference voltage lines V1$l$-Vml are disposed in every one pixel column.

The pixels PX positioned at one pixel column are alternately connected to one corresponding first reference voltage line V1$h$-Vmh and one corresponding second reference voltage line V1$l$-Vml, and the pixels PX positioned at one pixel row are connected to the same type of reference voltage lines. For example, in the exemplary embodiment of the present invention shown in FIG. 1, all of the pixels PX positioned at the first row (e.g., the pixels PX connected to the first gate line G1) are connected to the first reference voltage lines V1$h$-Vmh, and all of the pixels PX positioned at the second pixel row (e.g., the pixels PX connected to the second gate line G2) are connected to the second reference voltage lines V1$l$-Vml. However, according to an exemplary embodiment of the present invention, the pixels PX positioned at one pixel row may be connected to different types of reference voltage lines. For example, the pixels PX in one pixel row may be connected to high and low reference voltage lines.

The signal controller 600 receives input data and an input control signal from the outside. The input control signal may be used to control the display of image data included in the input data. The input control signal may include, e.g., a vertical synchronization signal Vsync, a horizontal synchronizing signal Hsync, a main clock signal MCLK, and a data enable signal DE. The signal controller 600 processes the input data to be suitable for an operating condition of the display panel 300 in response to the input control signal to generate image data DAT, a gate control signal CONT1, a data control signal CONT2, and a clock signal.

The gate control signal CONT1 may include a scanning start signal STV which indicates the start of the outputting of a gate-on voltage Von, a gate clock signal CPV which controls the output timing of the gate-on voltage Von, and the like.

The data control signal CONT2 may include a horizontal synchronization start signal STH which indicates the start of the inputting of the image data DAT, and a load signal TP which instructs data voltages to be applied to the data lines D1-D(m+1).

The gate lines G1-Gn of the display panel 300 are connected to the gate driver 400, and the gate driver 400 sequentially receives the gate-on voltage Von according to the gate control signal CONT1 applied from the signal controller 600.

A gate-off voltage Voff is applied to the gate lines G1 to Gn during a period in which the gate-on voltage Von is not applied.

The data lines D1-D(m+1) of the display panel 300 are connected to the data driver 500, and the data driver 500 receives the data control signal CONT2 and the image data DAT from the signal controller 600. The data driver 500 converts the image data DAT into a data voltage by using a gray voltage generated by a gray voltage generator and transfers the data voltage to the data lines D1-D(m+1). The data voltage includes a positive-polarity data voltage and a negative-polarity data voltage. The positive-polarity data voltage and the negative-polarity data voltage are alternately applied to the data lines D1-D(m+1) based on frames, columns, or rows, to be inverted. Such inversion is used for either displaying a moving image or displaying a still image, or for both.

Voltages which are applied to the reference voltage lines V1$h$-Vmh and V1$l$-Vml may be inverted, and the inverting cycle may be the same as a cycle in which the gate-on voltage Von is applied to the gate lines G1-Gn.

According to an exemplary embodiment of the present invention, various pixel connection structures other than those shown in FIG. 1 may be used in the display device.

Hereinafter, an arrangement of the reference voltage lines V1h-Vmh and V1l-Vml will be described in detail with reference to FIG. 2.

Figure 2:
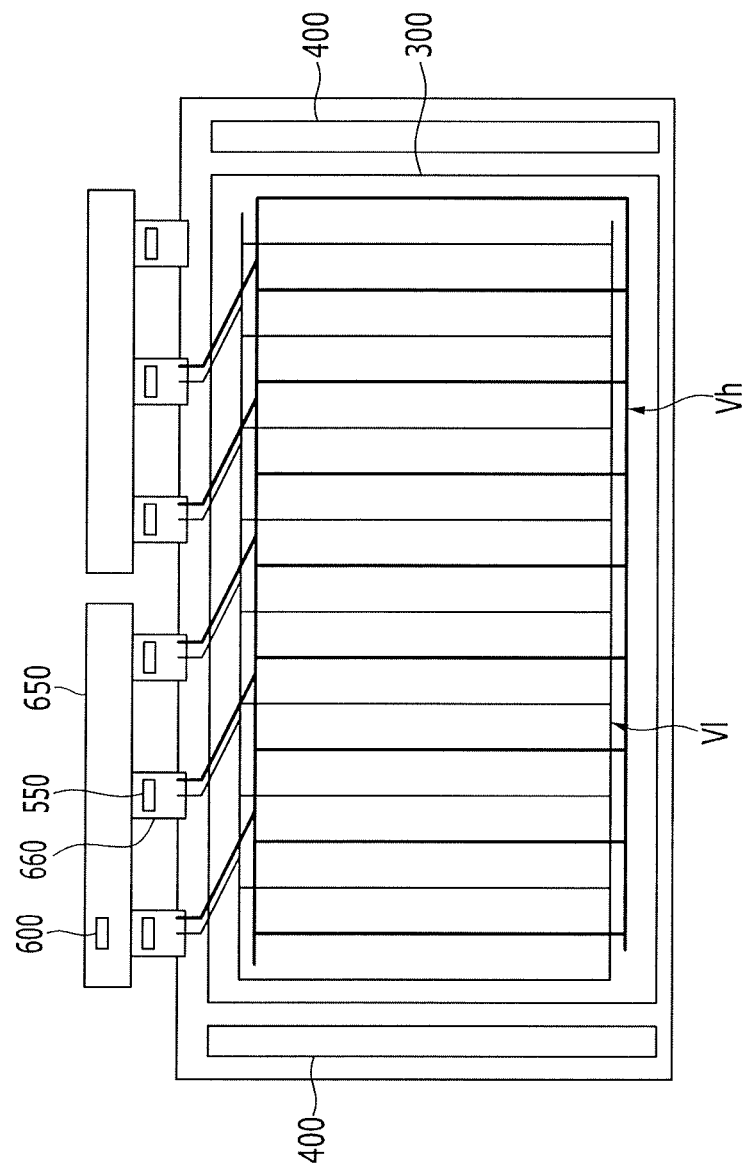
FIG. 2 illustrates a connection structure of a reference voltage line in a display device according to an exemplary embodiment of the present invention.

FIG. 2 illustrates a connection structure of a reference voltage line in a display device according to an exemplary embodiment of the present invention.

FIG. 2 schematically illustrates an actual display device. In the exemplary embodiment of the present invention, as shown in FIG. 2, the gate driver 400 is formed at left and right sides of a substrate in which the display panel 300 is formed. The gate driver 400 may be formed in a manufacturing process for forming the pixels PX. Further, a data driving integrated circuit (IC) chip 550 including the data driver 500, and the signal controller 600 are attached to an upper side of the substrate in which the display panel 300 is formed by using flexible printed circuit (FPC) boards 660 and a printed circuit board (PCB) 650.

Further, the reference voltage lines V1h-Vmh and V1l-Vml are connected to the display panel 300 through the FPC boards 660, and each of the first reference voltage lines V1h-Vmh and the second reference voltage lines V1l-Vml includes a plurality of main lines formed to extend in a vertical direction through their respective pixels PX and horizontal connectors for connecting the main lines. In the present exemplary embodiment, a pair of horizontal connectors is formed at upper and lower sides of the reference voltage lines V1h-Vmh and V1l-Vml.

Hereinafter, the structure of a pixel according to an exemplary embodiment of the present invention will be described in detail with reference to FIG. 3 and FIG. 4.

Figure 3:
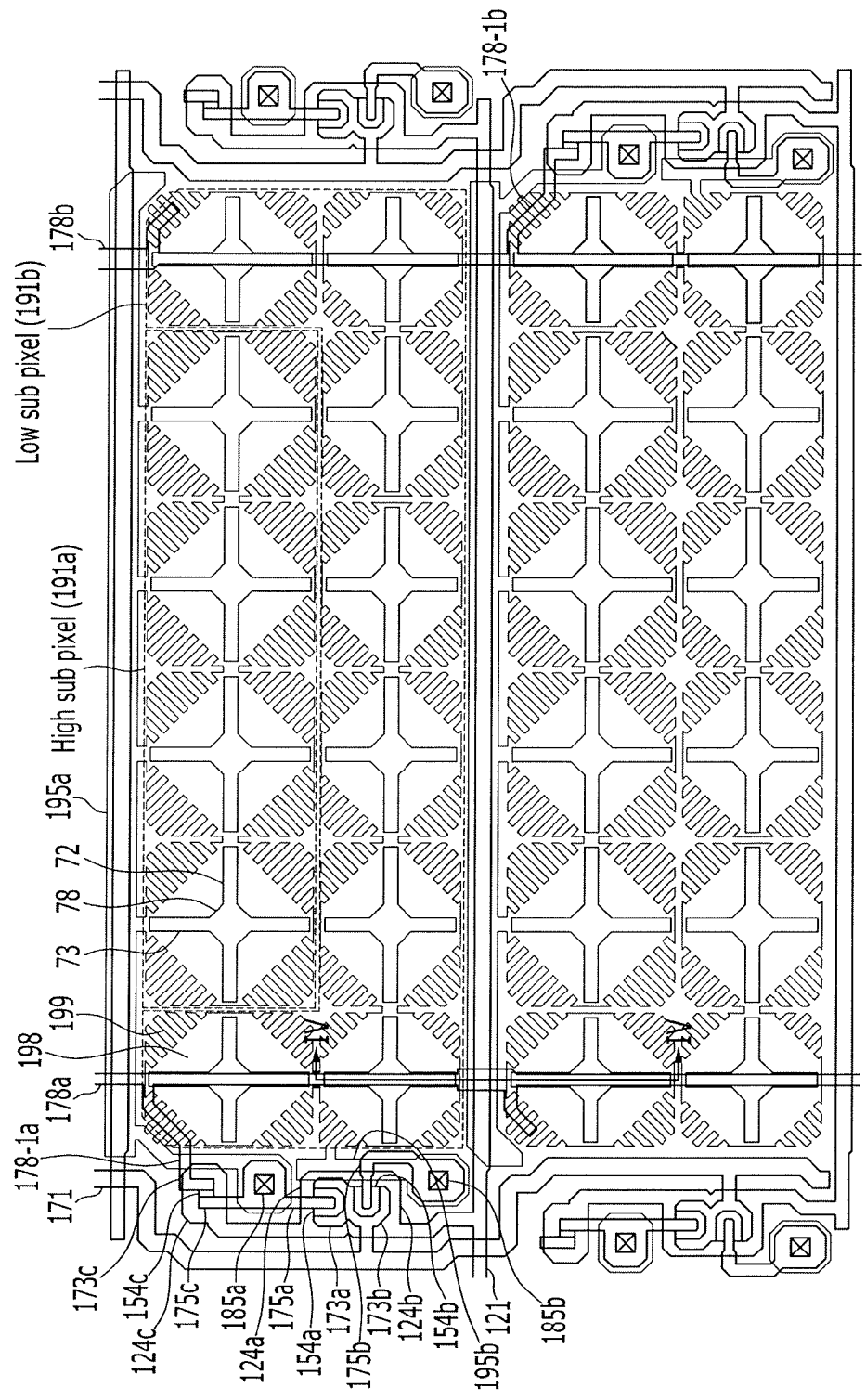
FIG. 3 is a layout view illustrating a pixel structure according to an exemplary embodiment of the present invention.
Figure 4:
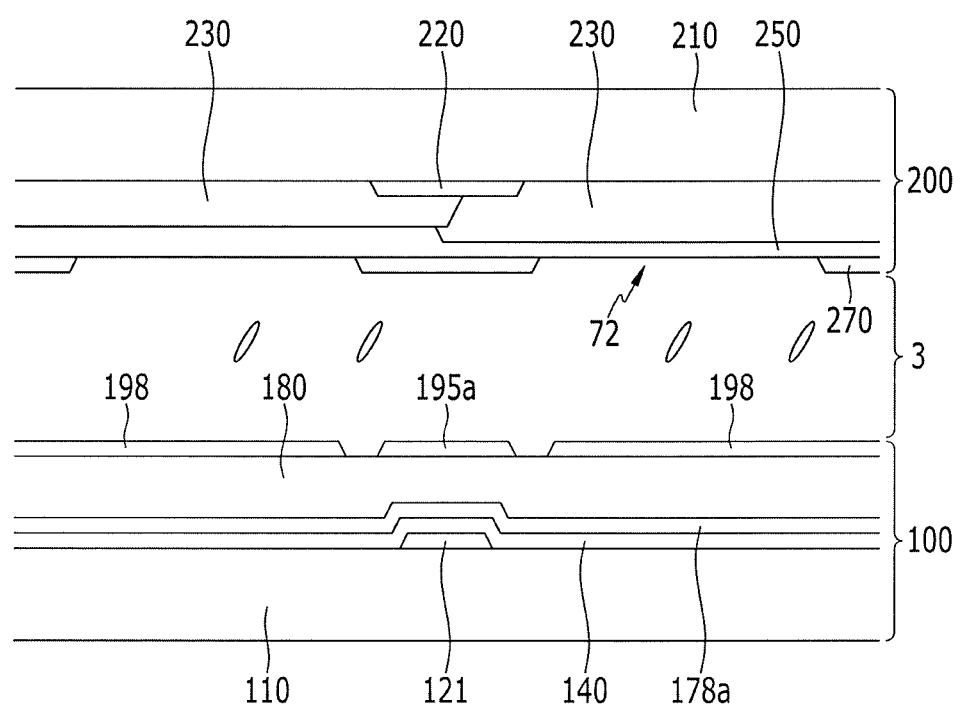
FIG. 4 is cross-sectional view taken along a line IV-IV of FIG. 3, according to an exemplary embodiment of the present invention.

FIG. 3 is a layout view illustrating a pixel structure according to an exemplary embodiment of the present invention, and FIG. 4 is cross-sectional view taken along a line IV-IV of FIG. 3, according to an exemplary embodiment of the present invention.

The display panel of the exemplary embodiment of the present invention shown in FIGS. 3 and 4 includes an upper display panel 200, a lower display panel 100, and a liquid crystal layer 3 disposed therebetween.

First, the lower display panel 100 will be described. A plurality of gate lines 121 is disposed on an insulation substrate 110.

The gate lines 121 are disposed to extend in a horizontal direction and include a first gate electrode 124a, a second gate electrode 124b, and a third gate electrode 124c, which are disposed to protrude upwardly from the gate lines 121. The first gate electrode 124a, the second gate electrode 124b, and the third gate electrode 124c are disposed such that the third gate electrode 124c extends upward from the gate lines 121 and then expands, and the first gate electrode 124a and the second electrode 124b extend again from the third gate electrode 124c. The first gate electrode 124a and the second gate electrode 124b may be formed in one expanded region.

A gate insulating layer 140 is disposed on the gate lines 121, and a first semiconductor 154a, a second semiconductor 154b, and a third semiconductor 154c are disposed respectively on the first gate electrode 124a, the second gate electrode 124b, and the third gate electrode 124c, above the gate insulating layer 140.

Data conductors including data lines 171, a first drain electrode 175a, a second drain electrode 175b, a third source electrode 173c, a third drain electrode 175c, and a pair of reference voltage lines 178a and 178b are disposed on the first semiconductor 154a, the second semiconductor 154b, and the third semiconductor 154c, above the gate insulating layer.

The data lines 171 are disposed to extend in a vertical direction and further include a first source electrode 173a and a second source electrode 173b respectively extending toward the first and second gate electrodes 124a and 124b.

The pair of reference voltage lines 178a and 178b are disposed to be parallel to the data lines 171, and are disposed between adjacent data lines 171. The pair of reference voltage lines 178a and 178b include main lines 178a and 178b disposed to be parallel with the data lines 171, and stems 178-1a and 178-1b respectively extended from the main lines 178a and 178b to be connected to the source electrode 173c of the compensation transistor. One pair of the reference voltage lines 178a and 178b are disposed every one pixel column, while one stem is formed for one pixel PX. As a result, one pixel PX is connected to one reference voltage line of the pair of reference voltage lines 178a and 178b.

The first drain electrode 175a is disposed to face the first source electrode 173a, the second drain electrode 175b is disposed to face the second source electrode 173b, and the third drain electrode 175c is disposed to face the third source electrode 173c. The third source electrode 173c is connected to the second drain electrode 175b.

The first gate electrode 124a, the first source electrode 173a, and the first drain electrode 175a constitute a first thin film transistor along with the first semiconductor 154a. The second gate electrode 124b, the second source electrode 173b, and the second drain electrode 175b constitute a second thin film transistor along with the second semiconductor 154b. The third gate electrode 124c, the third source electrode 173c, and the third drain electrode 175c constitute a third thin film transistor along with the third semiconductor 154c. In other words, the first thin film transistor and the second thin film transistor receive a data voltage through their source electrodes, while the third thin film transistor (e.g., the compensation transistor) receives a reference voltage through its source electrode. Herein, the reference voltage is varied between a high level and a low level, but a constant voltage level is applied while a gate-on voltage is applied.

A passivation layer is disposed on the data conductor, and a pixel electrode is disposed thereon.

One pixel electrode includes one high gray pixel electrode 191a and two low gray pixel electrodes 191b.

For example, the pixel electrode included in one pixel PX includes the high gray pixel electrode 191a serving as a pixel electrode of a high gray subpixel and the low gray pixel electrode 191b serving as a pixel electrode of a low gray subpixel.

The high gray pixel electrode 191a and the low gray pixel electrode 191b include 12 unit pixel electrodes 198 and 199 corresponding to a total number of domains. Each of the unit pixel electrodes includes a central electrode 198 and a plurality of branches 199 that are outwardly extended from a side or sides of the central electrode 198. The branches 199 may hereinafter be referred to as "minute branches". The minute branches 199 may be formed with an angle of about 45 degrees with respect to the horizontal direction or the vertical direction, or may be formed with an angle of about 40 degrees to about 50 degrees. Further, one side of the center electrode 198 may be perpendicular to the minute branches 199.

In the exemplary embodiment of the present invention shown in FIG. 3, the central electrode 198 is formed to be a size such that it is able to contact one side of a region at which the unit pixel electrode is formed. However, the central electrode 198 may be formed to have a smaller size. In this case, the minute branches 199 may be disposed at edges of the central electrode 198. An extension of the unit pixel electrode may be extended from the central electrode 198, or one of the minute branches 199. The unit pixel electrodes are connected to each other by their extension to receive the same voltage. For example, the unit pixel electrodes pertaining to one of the high gray pixel electrode 191a and the low gray pixel electrode 191b are connected to each other through their extensions, and are different from unit pixel electrodes pertaining to the other of the high gray pixel electrode 191a or the low gray pixel electrode 191b.

The first drain electrode 175a of the first thin film transistor is connected to the high gray pixel electrode 191a through a first contact hole 185a. In the exemplary embodiment of the present invention shown in FIG. 3, the first drain electrode 175a is connected to the high gray pixel electrode 191a through a first connector 195a formed along an upper portion of the pixel PX. The first connector 195a is bent to be connected to one unit pixel electrode of the high gray pixel electrode 191a. When connected to the high gray pixel electrode 191a, the structure of the first connector 195a is such that it is directly connected to the central electrode 198, as shown in FIG. 3.

The second drain electrode 175b of the second thin film transistor is connected to the low gray pixel electrode 191b through a second connector 195b. In this case, this connection is performed through a second contact hole 185b.

In the exemplary embodiment of the present invention shown in FIG. 3, four unit pixel electrodes disposed at the center of a first one of two rows at which the unit pixel electrodes are arranged in two rows constitute the high gray pixel electrode 191a, and the remaining unit pixel electrodes constitute the low gray pixel electrode 191b. This arrangement may be varied according to an exemplary embodiment of the inventive concept.

Further, the pair of reference voltage lines 178a and 178b are arranged to overlap the centers of their corresponding central electrodes 198 such that they can be covered by the central electrodes 198 of the unit pixel electrodes. In the exemplary embodiment of the present invention shown in FIG. 3, the pair of reference voltage lines 178a and 178b are arranged to overlap the central electrodes 198 of the unit pixel electrodes disposed at the leftmost and rightmost sides of one pixel PX. The reference voltage lines 178a and 178b may be arranged in various ways according to an exemplary embodiment of the present invention, but may be arranged in such a way so as to be covered by the central electrodes 198. When the same voltage is applied to the overlapped unit pixel electrodes, a constant effect may be applied thereto, thereby accomplishing constant display quality.

Next, the upper display panel 200 will be described. A common electrode 270 is disposed on an insulating substrate 210. In this case, the common electrode 270 is disposed to face the pixel electrode and to receive a common voltage Vcom.

Referring to FIG. 4, a color filter 230 and a light blocking member 220 are disposed in the upper display panel 200, and a planarization layer 250 is disposed to cover the color filter 230 and the light blocking member 220. The common electrode 270 is disposed below the planarization layer 250. According to an exemplary embodiment of the present invention, the color filter 230 and the light blocking member 220 may be disposed in the lower display panel 100.

As illustrated in FIG. 3 and FIG. 4, the common electrode 270 has openings 72, 73, and 78. According to an exemplary embodiment of the inventive concept, a protrusion structure may be formed to be used as a domain driver instead of the openings of the common electrode.

The openings 72, 73, and 78, serving as domain dividers, are formed in the common electrode 270 of one domain region at which the unit pixel electrodes 198 and 199 are disposed. For example, a cross-shaped opening including a horizontal opening 72 and a vertical opening 73 positioned to cross the horizontal opening 72 is formed in the common electrode 270. In the present exemplary embodiment, the common electrode 270 may further include the central opening 78 positioned at a central portion of the cross-shaped opening. The central opening 78 has a polygonal structure including four straight sides that are respectively positioned at four subregions divided by the cross-shaped opening. In the present exemplary embodiment, the central opening has a rhombic structure.

In the present exemplary embodiment, the openings 72, 73, and 78 are not connected to the openings of adjacent unit pixel electrodes. However, according to an exemplary embodiment of the present invention, the openings 72, 73, and 78 may be connected to adjacent unit pixel electrodes.

The liquid crystal layer 3 disposed between the lower display panel 100 and the upper display panel 200 has a plurality of liquid crystal molecules having negative dielectric anisotropy. The liquid crystal molecules may be aligned such that their major axes are substantially perpendicular to the two display panels 100 and 200 in a state in which no electric field is generated.

When a data voltage is transmitted to the pixel PX, the data voltage is applied as it is to the low gray pixel electrode 191b through the second thin film transistor. In contrast, a higher voltage is applied to the high gray pixel electrode 191a by the action of a data voltage applied through the first thin film transistor and a high reference voltage transferred through the third thin film transistor (e.g., the compensation transistor). As a result, voltages of different levels are applied to the high gray pixel electrode 191a and the low gray pixel electrode 191b.

The high-gray and low-gray pixel electrodes 191a and 191b to which the data voltages of the different levels are applied determine the orientation of the liquid crystal molecules of the liquid crystal layer 3 between the two electrodes 191a and 191b by generating an electric field along with the common electrode 270 of the upper display panel 200. In this case, the inclination direction of the liquid crystal molecules may be first determined by a horizontal component generated by a gap where no pixel electrode is disposed and a side of the opening of the common electrode 270 distorting the main electric field approximately perpendicular to the surface of the display panel. The horizontal component of the main electric field is almost perpendicular to the sides of the unit pixel electrode and the opening of the common electrode 270, and thus, the liquid crystal molecules are inclined in the direction approximately perpendicular to the sides of the unit pixel electrode and the opening of the common electrode 270.

Figure 5:
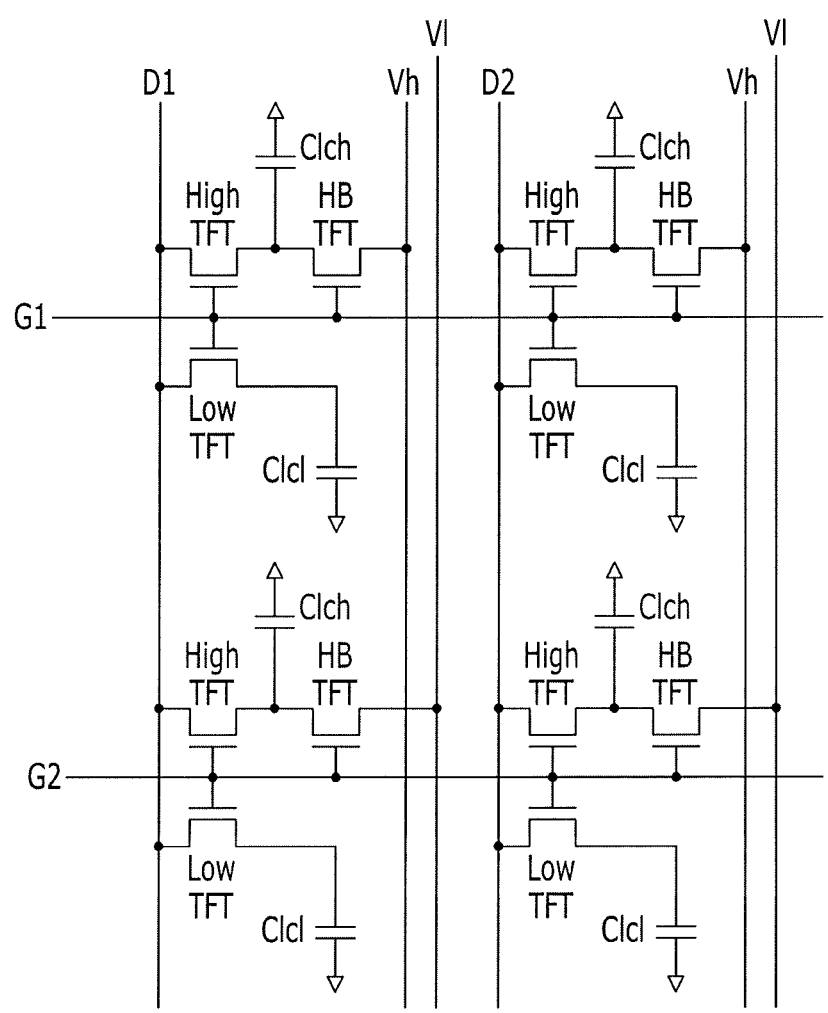
FIG. 5 is a circuit diagram of a pixel according to an exemplary embodiment of the present invention.

A circuit diagram of a display device having this pixel structure is illustrated in FIG. 5.

FIG. 5 is a circuit diagram of a pixel according to an exemplary embodiment of the present invention.

One pixel PX includes a first thin film transistor High TFT, a second thin film transistor Low TFT, and a compensation transistor HB TFT, and further includes a high gray liquid crystal capacitor Clch formed of the high gray pixel electrode 191a, the common electrode 270, and the liquid crystal layer 3 and a low gray liquid crystal capacitor Clcl formed of the low gray pixel electrode 191b, the common electrode 270, and the liquid crystal layer 3.

The high gray liquid crystal capacitor Clch is charged with a higher voltage since a data voltage that is applied to the first thin film transistor High TFT is boosted up by a reference voltage that is applied from reference voltage lines Vh and Vl. When a negative data voltage is applied to one pixel PX in a frame, a positive voltage is also applied to the pixel PX through the reference voltage line (Vh or Vl) connected thereto, and thus the boosting-up operation is performed. When a positive data voltage is applied to one pixel PX in a next frame, a negative voltage is also applied to the pixel PX through the reference voltage line (Vh or Vl), and thus the boosting-up operation is performed. In other words, a higher voltage is obtained based on the common voltage.

As such, the connection between the reference voltage line (Vh or Vl) and the pixel PX is performed based on polarity inversion. In the exemplary embodiment of the present invention shown in FIG. 5, a display panel using dot inversion is illustrated. If polarity inversion is changed, the connection between the reference voltage line (Vh or Vl) and the pixel PX may be changed.

Figure 6:
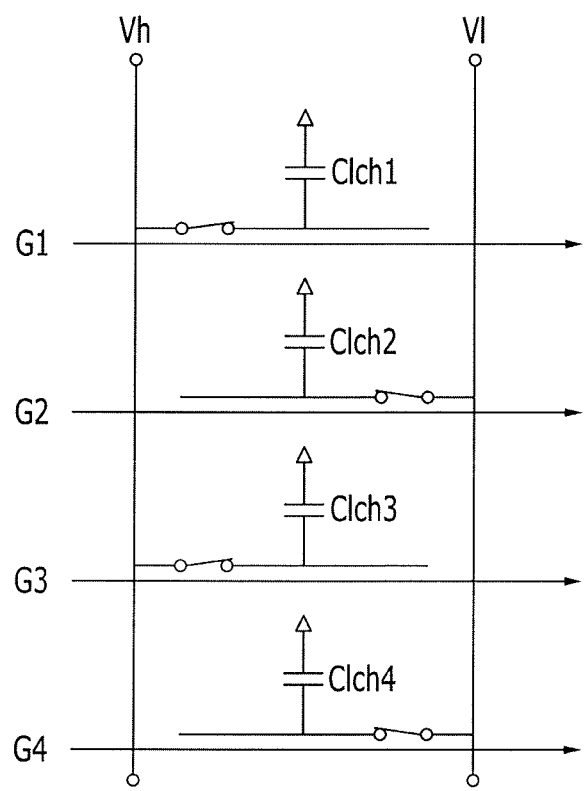
FIG. 6 illustrates a wire connection relationship in an operation of a pixel in a circuit diagram of the pixel according to an exemplary embodiment of the present invention.

When the display device having the same structure as that illustrated in FIG. 5 is actually driven, the connection illustrated in FIG. 6 is performed.

FIG. 6 illustrates a wire connection relationship in an operation of a pixel in a circuit diagram of the pixel according to an exemplary embodiment of the present invention.

For example, the pair of reference voltage lines Vh and Vl formed at one pixel column supply a voltage to the high gray liquid crystal capacitor Clch of the pixels of pixel column. For example, when a gate-on voltage is applied to a first gate line G1, a high gray liquid crystal capacitor Clch1 disposed in a pixel connected to the first gate line G1 is connected to the first reference voltage line Vh. When the gate-on voltage is applied to a second gate line G2, a high gray liquid crystal capacitor Clch2 disposed in a pixel connected to the second gate line G2 is connected to the second reference voltage line Vl. When the gate-on voltage is applied to a third gate line G1, a high gray liquid crystal capacitor Clch 3 disposed in a pixel connected to the third gate line G3 is connected to the first reference voltage line Vh. When the gate-on voltage is applied to a fourth gate line G4, a high gray liquid crystal capacitor Clch4 disposed in a pixel connected to the fourth gate line G4 is connected to the second reference voltage line Vl.

As such, although the gate-on voltage is applied to one pixel column, one of the pair of reference voltage lines Vh and Vl disposed in each pixel column is connected to the high gray liquid crystal capacitor disposed in the corresponding pixel. As a result, the load of the reference voltage line Vh or Vl is not significantly changed. In other words, in the present exemplary embodiment, even when the gate-on voltage is applied to one gate line, the load of one reference voltage line is slightly changed by connecting the high gray liquid crystal capacitor of one pixel.

Hereinafter, load variation of a reference voltage line in comparative embodiments shown in FIG. 7 and FIG. 8 will be described through comparison with an exemplary embodiment of the present invention.

Figure 7:
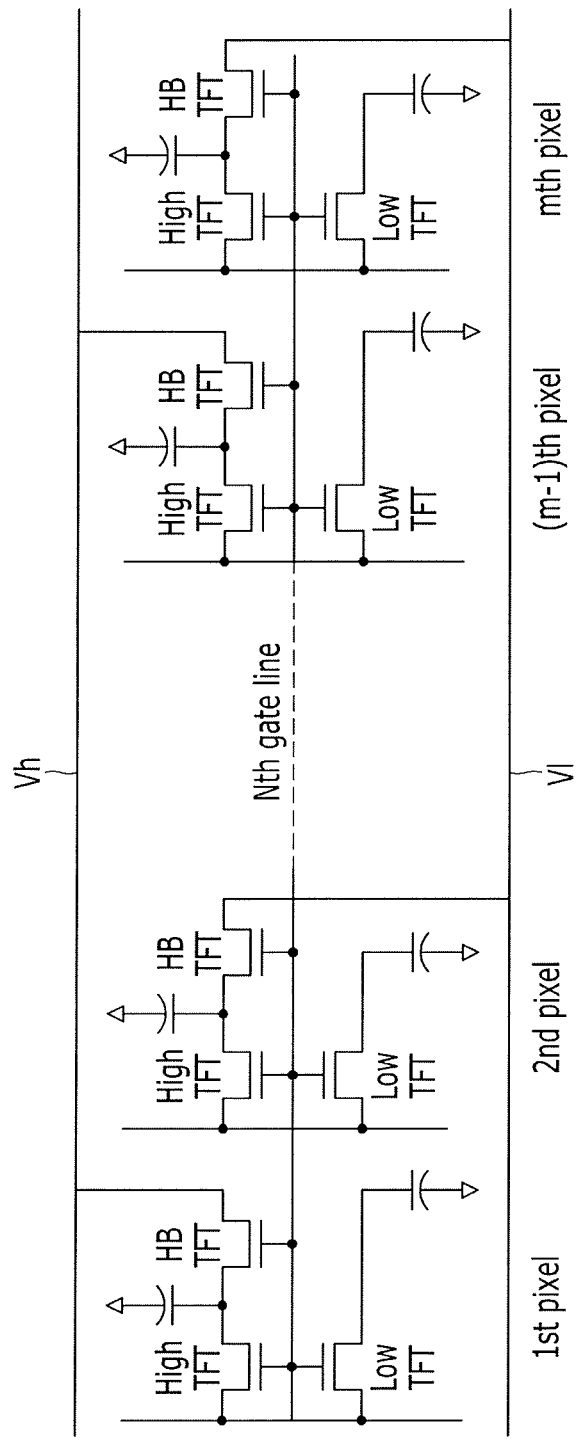
FIG. 7 is a circuit diagram of a pixel according to a comparative embodiment.
Figure 8:
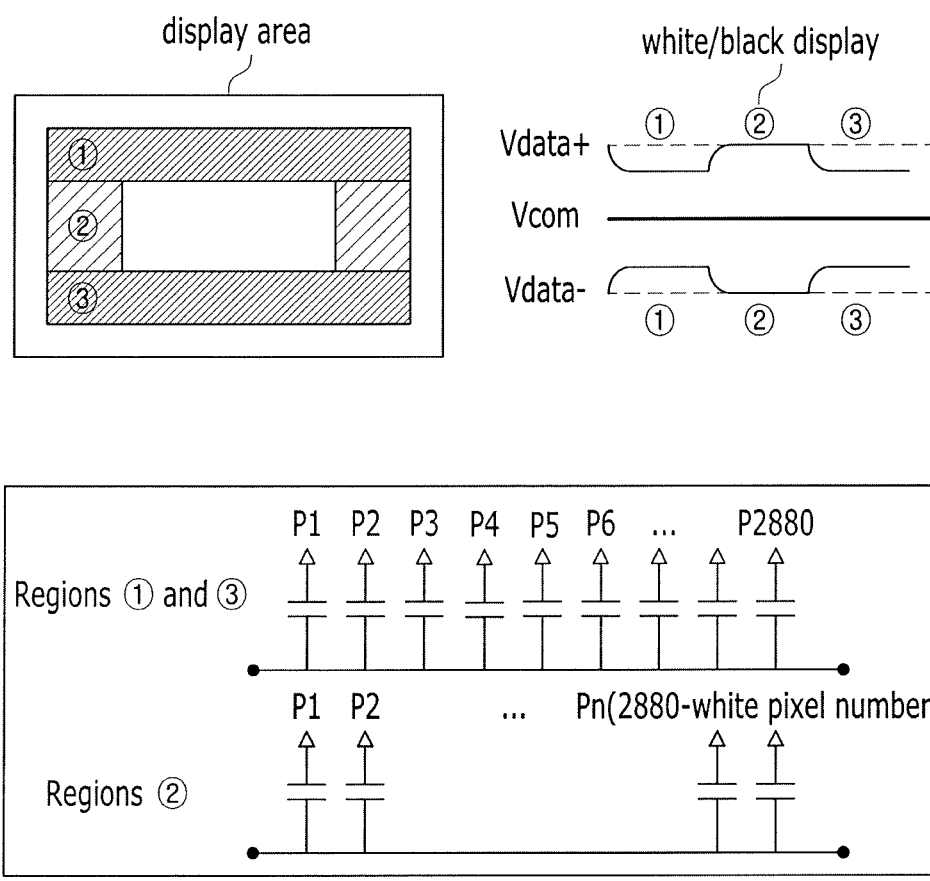
FIG. 8 illustrates a variation of a reference voltage and a wire connection relationship of a pixel according to a comparative embodiment.

FIG. 7 is a circuit diagram of a pixel according to a comparative embodiment, and FIG. 8 illustrates a variation of a reference voltage and a wire connection relationship of a pixel according to a comparative embodiment.

First, in the comparative example of FIG. 7, one pixel (e.g., one of $1^{st}$ to mth pixels) includes three thin film transistors (e.g., High TFT, Low TFT and HB TFT) and two liquid crystal capacitors.

Further, in the comparative embodiment of FIG. 7, a pair of reference voltage lines (e.g., Vh and Vl) are disposed to extend parallel to a gate line (e.g., Nth gate line), and the pixels disposed in an extending direction of rows are connected to different reference voltage lines. For example, half of the pixels of a row are connected to the reference voltage line Vh and the other half of the pixels of the row are connected to the reference voltage line Vl.

As a result, when a gate-on voltage is applied to the Nth gate line, the number of high gray liquid crystal capacitors connected to one reference voltage line can be reach a half of the total number of pixel rows, and thus the load of the reference voltage line is significantly changed.

Further, as illustrated in FIG. 8, the load of the reference voltage line is more significantly changed when a white box is displayed at the center of the display area.

The white box displayed at the center of the display area is illustrated in an upper left side of FIG. 8. The pixel structure of the display device described with reference to FIG. 8 is the same as that illustrated in FIG. 7. Further, the display area is divided into three regions ①, ②, and ③ in the left side of FIG. 8. The regions ① and ③ include pixel rows for displaying black. For example, the region ① corresponds to black pixel rows positioned at an upper side of the white box, and the region ③ corresponds to black pixel rows positioned at a lower side of the white box. The region ② includes pixel rows for displaying white at the center of one row.

A case of displaying black and a case of displaying white are illustrated in the upper right side of FIG. 8.

For example, in the upper right side of FIG. 8, the black (① and ③) is displayed by applying the lowest voltage to the pixel electrode with respect to the common voltage Vcom, and the white (some pixels of ②) is displayed by applying the highest voltage to the pixel electrode with respect to the common voltage Vcom.

A voltage that is applied through the reference voltage line in the display panel of FIG. 7 and FIG. 8 has substantially the same level as that of the data voltage for displaying white. Accordingly, when the white is displayed, substantially no current is transferred from the reference voltage line to the pixel electrode. As a result, load is not added into the reference voltage line. In contrast, when the black is displayed, as a current is applied from the reference voltage line, it is as if a load is added to the reference voltage line.

This is illustrated in a lower side of FIG. 8.

As illustrated in the lower side of FIG. 8, when the black (① and ③) is displayed, the reference voltage line has the same equivalent circuit as in the case where loads are added into all the pixels. When the white (some pixels of ②) is displayed, the reference voltage line has the same equivalent circuit as in the case of adding no load.

A total number of the pixels pertaining to one row is three times (in the case of the three colors of RGB) as many as the pixel number for resolution. Accordingly, in the case of full high definition (HD), 5760 (1920×3) capacitors are attached, generating a large load difference between the pixel rows of ① and ③ and the pixel rows of ②.

As a result, when the gate-on voltage is sequentially applied to the gate lines one by one, the same black is displayed in the pixel rows of ① and ③, but pixels pertaining to the pixel rows of ② for displaying black display gray instead of black as the load of the reference voltage line is reduced.

This is because the load connected to one reference voltage line may be significantly changed whenever the gate-on voltage is applied to one gate line.

However, in accordance with the pixel structure according to an exemplary embodiment of the present invention pixel, one liquid crystal capacitor is added to one reference voltage line at the time of applying a gate-on voltage, as illustrated in FIG. 5 and FIG. 6, and thus no significant variation is generated in the reference voltage, thereby causing no display quality deterioration.

In the aforementioned exemplary embodiments of the present invention, it is described that one liquid crystal capacitor is connected to the reference voltage line at the time of applying a gate-on voltage. However, since the variation of the reference voltage is to be small enough to ignore, about several tens of liquid crystal capacitors may be simultaneously connected to the reference voltage line.

To further reduce an effect of the variation of the reference voltage on the display quality, when disposed to extend through one pixel, two reference voltage lines may be overlapped with the pixel electrode (e.g., the high gray pixel electrode 191a or the low gray pixel electrode 191b), as illustrated in FIG. 3. The case in which the low gray pixel electrode is overlapped with the pair of reference voltage lines is illustrated in FIG. 5.

Further, the pixel electrode may have various structures, which will be described with reference to FIG. 9, FIG. 10 and FIG. 11.

Figure 9:
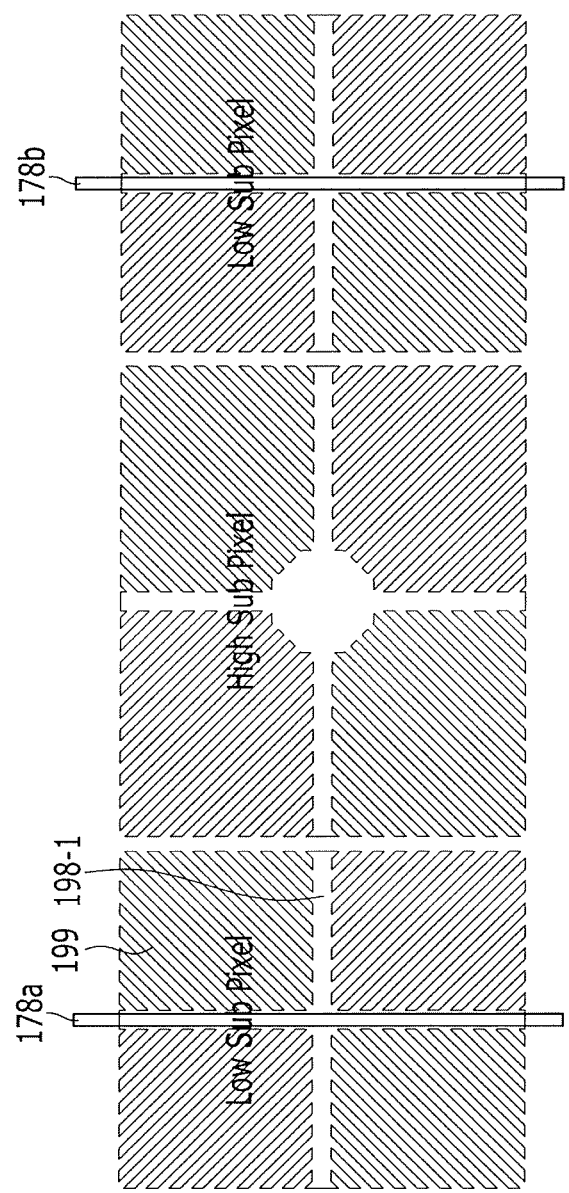
FIG. 9, FIG. 10 and FIG. 11 each illustrate a disposition of a pixel electrode and a reference voltage line according to an exemplary embodiment of the present invention.
Figure 10:
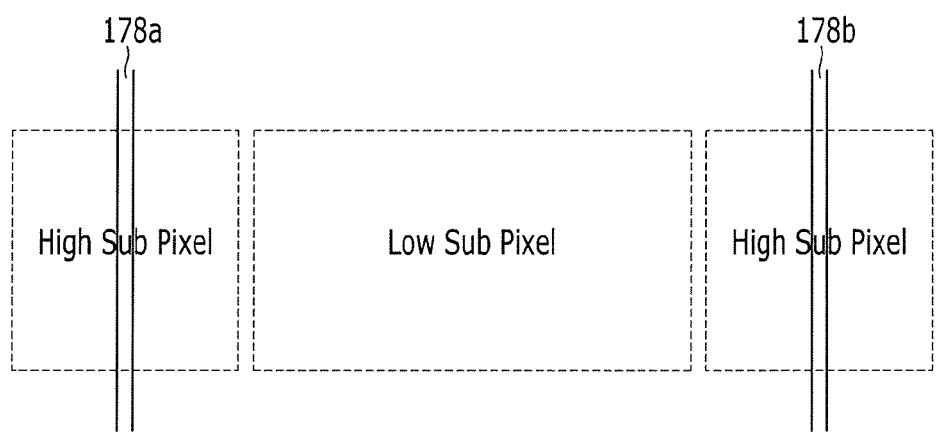
Figure 11:
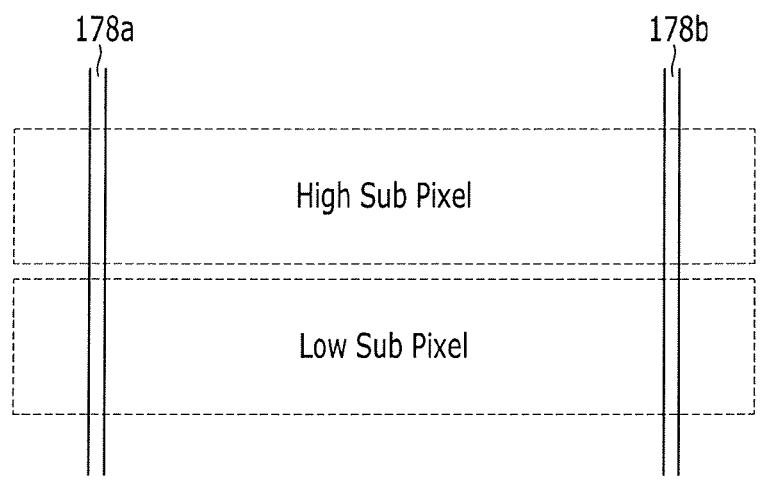

FIG. 9, FIG. 10 and FIG. 11 each illustrate a disposition of a pixel electrode and a reference voltage line according to an exemplary embodiment of the present invention.

For example, as illustrated in FIG. 9, the pair of reference voltage lines 178a and 178b are formed along a left side and a right side of the low gray subpixel electrode Low sub pixel, and one pixel includes two low gray subpixel electrodes Low sub pixel and one high gray subpixel electrode High sub pixel.

Each of the high gray subpixel electrode High sub pixel and the low gray subpixel electrodes Low sub pixel includes a cross-shaped stem 198-1 and a plurality of minute branches 199 which are outwardly extended from the cross-shaped stem 198-1. The minute branches 199 may be formed with an angle of about 45 degrees with respect to the horizontal direction or the vertical direction, or may be formed with an angle of about 40 degrees to about 50 degrees.

According to the exemplary embodiment of the present invention shown in FIG. 9, in the high gray subpixel electrode High sub pixel, a central stem is formed at the center of the cross-shaped stem 198-1, and the central stem is illustrated to have an octagonal shape. However, according to an exemplary embodiment of the present invention, the central stem may be formed to have various shapes, including a quadrangular shape. Further, each of the low gray subpixel electrodes Low sub pixel may have a central stem.

The pixel electrode of FIG. 9 is formed to extend in the horizontal direction, the high gray subpixel electrode High sub pixel is disposed at the center of the pixel area, and the pair of the low gray subpixel electrodes Low sub pixel are disposed at opposite sides of the high gray subpixel electrode High sub pixel. The pair of reference voltage lines 178a and 178b are disposed to overlap vertical portions of the cross-shaped stems of the pair of the low gray subpixel electrodes Low sub pixel.

According to the structure of the pixel electrode of FIG. 9, no central electrode is formed.

In other words, according to an exemplary embodiment of the present invention, a central electrode (e.g., 198 in FIG. 3) or a cross-shaped stem (e.g., as shown in FIG. 9) may be used, and a central stem (e.g., as shown in FIG. 9) may be formed at the center of the cross-shaped stem.

As such, the pixel electrode may have various structures. Hereinafter, a subpixel area in which a subpixel electrode is disposed and a position relationship of the pair of reference voltage lines 178a and 178b will be described with reference to FIG. 10 and FIG. 11.

First, as illustrated in FIG. 10, a pair of high gray subpixel electrodes High sub pixel are overlapped with the pair of reference voltage lines 178a and 178b.

According to the exemplary embodiment of the present invention shown in FIG. 10, a low gray subpixel electrode Low sub pixel is disposed at the center of the pixel area, and the pair of the high gray subpixel electrodes High sub pixel are disposed at opposite sides of the low gray subpixel electrode Low sub pixel.

In addition, as shown in FIG. 11, the pixel area is formed of two rows of unit pixel electrodes, and one row includes a high gray subpixel electrode High sub pixel and the other row includes a low gray subpixel electrode Low sub pixel. Further, a pair of reference voltage lines 178a and 178b are disposed at opposite sides of the high gray subpixel electrode High sub pixel and the low gray subpixel electrode Low sub pixel to overlap the two subpixel electrodes.

In one subpixel area indicated by dotted lines in FIG. 10 and FIG. 11, at least one unit pixel electrode (e.g., a central electrode or a cross-shaped stem and a plurality of minute branch electrodes) may be formed.

The aforementioned exemplary embodiments of the present invention were described by dividing the central electrode and the cross-shaped stem. Hereinafter, the term 'pixel central part' may be used to indicate a combination of the central electrode and the cross-shaped stem.

In the above liquid crystal displays according to the exemplary embodiments of the present invention, a unit pixel electrode has the minute branches 199, and since the number of unit pixel electrodes is high, the number of the minute branches 199 is high. As a result, the liquid crystal control force, for example, the force used to control the liquid crystal molecules, may be sufficiently obtained, and thus, a prepolymer polymerized by light may not be additionally included in the liquid crystal layer.

However, according to an exemplary embodiment of the present invention, the liquid crystal control force may be partially decreased, and thus, the prepolymer may be included in the liquid crystal layer.

A method of forming a pretilt in the case of including the prepolymer will be described with reference to FIG. 12.

Figure 12:
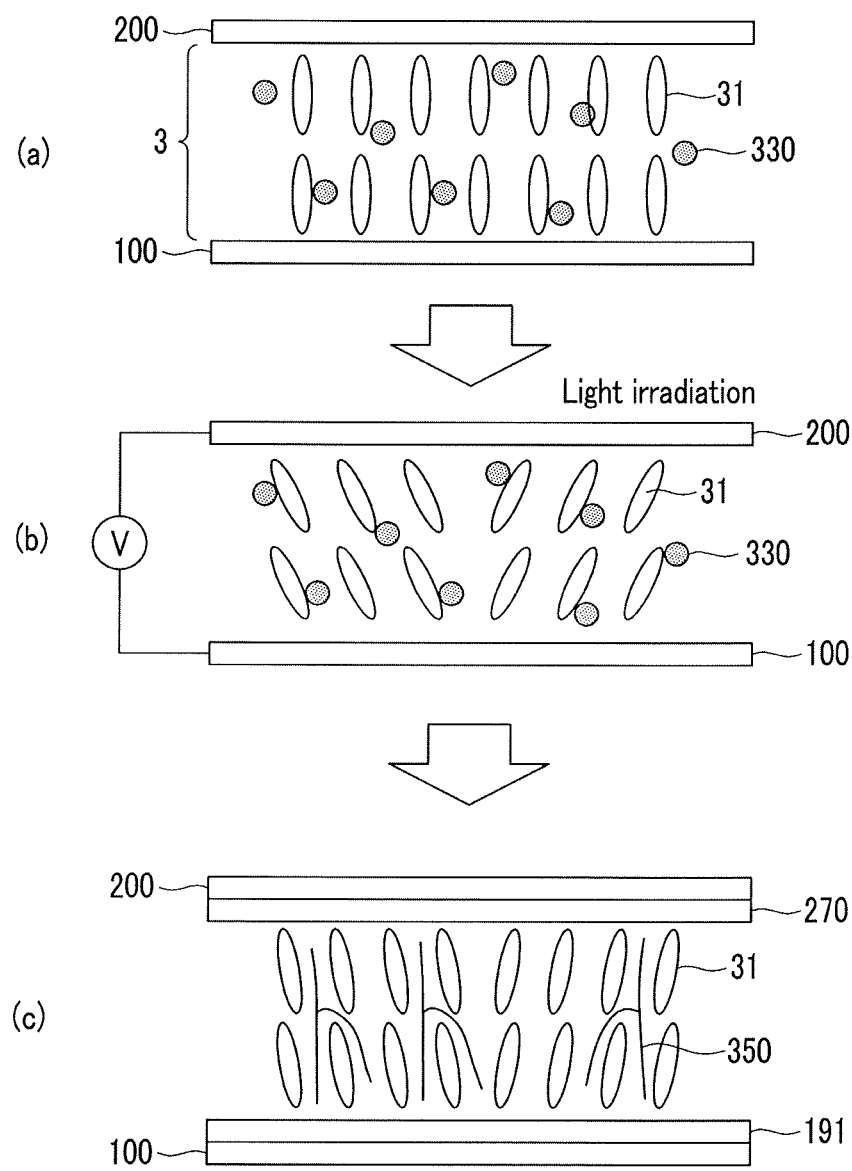
FIG. 12 illustrates a process for providing a pretilt to liquid crystal molecules by using prepolymers that are polymerized by light, such as ultraviolet rays, according to an exemplary embodiment of the present invention.

FIG. 12 illustrates a process for providing a pretilt to liquid crystal molecules by using prepolymers that are polymerized by light, such as ultraviolet rays, according to an exemplary embodiment of the present invention.

Referring to FIG. 12, in (a), prepolymers 330, such as a monomer that is polymerized by light, such as ultraviolet rays, are injected along with a liquid crystal material between the two display panels 100 and 200. The prepolymer 330 may be a reactive mesogen that is polymerized by light, such as ultraviolet rays.

Next, in (b), an electric field is generated in a liquid crystal layer 3 between the two display panels 100 and 200 by applying a data voltage to the first and second subpixel electrodes of the lower display panel 100 and applying a common voltage to the common electrode of the upper display panel 200. Thus, liquid crystal molecules 31 of the liquid crystal layer 3 are inclined in a predetermined direction in response to the electric field.

As such, if the light from ultraviolet rays is irradiated in the state that the liquid crystal molecules 31 of the liquid crystal layer 3 are inclined in the predetermined direction, the prepolymer 330 is polymerized, and thus a pretilt providing polymer 350 is formed, as shown in (c) of FIG. 12. The pretilt providing polymer 350 contacts the display panels 100 and 200. Alignment directions of the liquid crystal molecules 31 are determined such that the liquid crystal molecules 31 have a pretilt in the aforementioned directions. Accordingly, the liquid crystal molecules 31 are arranged to have a pretilt corresponding to four different directions, even in a state in which a voltage is not applied to the field generating electrodes 191 and 270.

As a result, the liquid crystal molecules 31 have pretilt in four directions in each region of the upper and lower subpixels among one pixel.

The pretilt using the polymer as shown in FIG. 12 may also be used in the case when the texture is not reduced through the control of the liquid crystal control force provided by the minute branches 199 of the color filter 230.

The exemplary embodiment of the present invention in FIG. 12 has been described based on the case that the liquid crystal layer 3 includes the photo-reactive material, however, the aforementioned pretilt directions of the liquid crystal molecules shown in (c) of FIG. 12 can result in the case when the alignment layer includes the photo-reactive material.

In accordance with an exemplary embodiment of the present invention there is provided a display device capable of preventing display quality deterioration by reducing a variation of a reference voltage by configuring one pixel with two subpixels that receive different voltages.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. A liquid crystal display, comprising:
a first substrate;
gate lines disposed on the first substrate and extending in a first direction;
a first thin film transistor, a second thin film transistor, and a compensation transistor which are disposed on the first substrate;
a first gray subpixel electrode connected to a drain electrode of the first thin film transistor;
a second gray subpixel electrode connected to a drain electrode of the compensation transistor and a drain electrode of the second thin film transistor; and
a first reference voltage line and a second reference voltage line each extending in a second direction different from the first direction,
wherein
one of the first and second reference voltage lines is connected to a source electrode of the compensation transistor, and
each of the first reference voltage line and the second reference voltage line overlaps both the first and second gray subpixel electrodes.

2. The liquid crystal display of claim 1, wherein
the second gray subpixel electrode and the first gray subpixel electrode are adjacent to each other in the second direction, and
each of the first and second gray subpixel electrodes is longer in the first direction than in the second direction.

3. The liquid crystal display of claim 2, wherein each of the first gray subpixel electrode and the second gray subpixel electrode includes at least one unit pixel electrode, and
each of the unit pixel electrodes includes one pixel central part and a plurality of branches extending from the pixel central part.

4. The liquid crystal display of claim 3, further comprising:
a second substrate opposing the first substrate;
a liquid crystal layer between the first substrate and the second substrate; and
a common electrode disposed between the liquid crystal layer and the second substrate,
wherein the common electrode includes a cross-shaped opening overlapping the pixel central part.

5. The liquid crystal display of claim 4, wherein the common electrode further includes a central opening disposed at a center of the cross-shaped opening.

6. The liquid crystal display of claim 3, wherein the first and second reference voltage lines respectively overlap the pixel central part of each of the first and second gray subpixel electrodes.

7. The liquid crystal display of claim 1, further comprising:
data lines extending in the second direction,
wherein gate electrodes of the first and second thin film transistors and the compensation transistor all are connected to a same first gate line.

8. The liquid crystal display of claim 7, wherein both of source electrodes of the first and second thin film transistors are connected to a same first data line.

9. The liquid crystal display of claim 8, wherein the first and second thin film transistors, the compensation transistor, the first gray subpixel electrode, and the second gray subpixel electrode are included in a first pixel,
a second pixel disposed adjacent to the first pixel in the second direction is connected to a second gate line and a second data line, and
the first pixel and the second pixel are connected to different ones of the first and second reference voltage lines from each other.

10. The liquid crystal display of claim 9, wherein
a voltage level of the first reference voltage line is different from a voltage level of the second reference voltage line, and
the voltage level of each of the first and second reference voltage lines swings between a high level and a low level at a predetermined cycle.

11. The liquid crystal display of claim 8, wherein the first and second thin film transistors, the compensation transistor, the first gray subpixel electrode, and the second gray subpixel electrode are included in a first pixel,
a third pixel disposed adjacent to the first pixel in the first direction is connected to the first gate line and a third data line, and
the reference voltage line among the first and second reference voltage lines connected to the first pixel and the reference voltage line among the first and second reference voltage lines connected to the third pixel and the reference transmit a same voltage.

12. The liquid crystal display of claim 11, wherein
a voltage level of the first reference voltage line is different from a voltage level of the second reference voltage line, and
the voltage level of each of the first and second reference voltage lines swings between a high level and a low level at a predetermined cycle.

\* \* \* \* \*